(12) United States Patent
Sekiya

(10) Patent No.: US 12,374,535 B2
(45) Date of Patent: Jul. 29, 2025

(54) WAFER PROCESSING APPARATUS AND WAFER PROCESSING METHOD

(71) Applicant: DISCO CORPORATION, Tokyo (JP)

(72) Inventor: Kazuma Sekiya, Tokyo (JP)

(73) Assignee: DISCO CORPORATION, Tokyo (JP)

(*) Notice: Subject to any disclaimer, the term of this patent is extended or adjusted under 35 U.S.C. 154(b) by 0 days.

(21) Appl. No.: 18/658,455

(22) Filed: May 8, 2024

(65) Prior Publication Data
US 2024/0395512 A1    Nov. 28, 2024

(30) Foreign Application Priority Data
May 22, 2023    (JP) .................... 2023-083828

(51) Int. Cl.
| | | |
|---|---|---|
| H01J 37/32 | (2006.01) | |
| C23C 14/14 | (2006.01) | |
| C23C 14/34 | (2006.01) | |
| C23C 14/50 | (2006.01) | |
| H01J 37/34 | (2006.01) | |

(52) U.S. Cl.
CPC ........ *H01J 37/32816* (2013.01); *C23C 14/14* (2013.01); *C23C 14/34* (2013.01); *C23C 14/50* (2013.01); *H01J 37/32715* (2013.01); *H01J 37/32899* (2013.01); *H01J 37/34* (2013.01); *H01J 2237/332* (2013.01)

(58) Field of Classification Search
None
See application file for complete search history.

(56) References Cited

U.S. PATENT DOCUMENTS

| | | | | |
|---|---|---|---|---|
| 4,615,755 A | * | 10/1986 | Tracy | H01J 37/32541 |
| | | | | 204/192.32 |
| 2011/0117702 A1 | * | 5/2011 | Rietzler | H01L 23/5389 |
| | | | | 118/712 |

FOREIGN PATENT DOCUMENTS

| | | | | |
|---|---|---|---|---|
| JP | 2022044315 A | | 3/2022 | |
| KR | 20180137393 A | * | 12/2018 | |
| WO | WO-2013186058 A1 | * | 12/2013 | ....... B01L 9/50 |

* cited by examiner

*Primary Examiner* — Jason Berman
(74) *Attorney, Agent, or Firm* — Greer, Burns & Crain, Ltd

(57) ABSTRACT

A wafer processing apparatus includes a holder which holds a wafer by sandwiching an outer circumferential surplus region of the wafer between a face side and a reverse side thereof, a vacuum chamber which houses the holder therein such that the wafer held by the holder defines an upper compartment and a lower compartment in the vacuum chamber, an evacuating unit which evacuates the upper compartment and the lower compartment and developing a positive pressure in the lower compartment with respect to the upper compartment to cancel out flexing of the wafer held by the holder, and a processing unit which is disposed in the vacuum chamber to perform a predetermined process on the wafer held by the holder.

12 Claims, 6 Drawing Sheets

WAFER PROCESSING APPARATUS AND WAFER PROCESSING METHOD

BACKGROUND OF THE INVENTION

Field of the Invention

The present invention relates to a wafer processing apparatus and a wafer processing method.

Description of the Related Art

Wafers with devices such as integrated circuits (ICs), large scale integration (LSI) circuits, or other circuits constructed thereon are divided into individual device chips by a dicing apparatus. Japanese Patent Laid-open No. 2022-44315 discloses a grinding method for grinding, with grindstones mounted on a spindle, a reverse side of a wafer that is opposite its face side that has a device region and an outer circumferential surplus region around the device region.

SUMMARY OF THE INVENTION

After a wafer has been thinned down in a grinding step, the wafer is processed in a subsequent process. In the subsequent process, it has been the general practice to affix a support substrate to the wafer such that the wafer can be handled with ease as it is supported on the support substrate. However, it has been demanded that the wafer be processed appropriately without being supported on a support substrate.

It is therefore an object of the present invention to provide a wafer processing apparatus and a wafer processing method that allow a wafer to be processed appropriately without being supported on a support substrate.

In accordance with an aspect of the present invention, there is provided a wafer processing apparatus for processing a wafer having on a face side thereof a device region in which a plurality of devices are formed and an outer circumferential surplus region around the device region, including a holder which holds the wafer by sandwiching the outer circumferential surplus region of the wafer between the face side and a reverse side thereof that is opposite the face side, a vacuum chamber which houses the holder therein such that the wafer held by the holder defines an upper compartment and a lower compartment in the vacuum chamber, an evacuating unit which evacuates the upper compartment and the lower compartment and develops a positive pressure in the lower compartment with respect to the upper compartment to cancel out flexing of the wafer held by the holder due to gravity, and a processing unit which is disposed in the vacuum chamber to perform a predetermined process on the wafer held by the holder.

Preferably, the processing unit forms a metal film on the reverse side of the wafer in alignment with the device region. Preferably, the wafer has a circular recess defined in the device region and an annular ridge disposed on the outer circumferential surplus region and surrounding the circular recess.

In accordance with another aspect of the present invention, there is provided a wafer processing method for processing a wafer having on a face side thereof a device region in which a plurality of devices are formed and an outer circumferential surplus region around the device region, including a vacuum chamber preparing step of preparing a vacuum chamber which houses a holder for holding the wafer by sandwiching the outer circumferential surplus region of the wafer between the face side and a reverse side thereof that is opposite the face side, a holding step of holding the wafer with the holder, a defining step of defining an upper compartment and a lower compartment in the vacuum chamber with the wafer held by the holder, an evacuating step of evacuating the upper compartment and the lower compartment and developing a positive pressure in the lower compartment with respect to the upper compartment to cancel out flexing of the wafer held by the holder due to gravity, and after the evacuating step, a processing step of performing a predetermined process on the wafer held by the holder with a processing unit disposed in the vacuum chamber.

Preferably, the processing step includes a step of forming a metal film on the reverse side of the wafer in alignment with the device region. Preferably, in the wafer processing method, the wafer has a circular recess defined in the device region and an annular ridge disposed on the outer circumferential surplus region and surrounding the circular recess.

The present invention is advantageous in that a wafer can be processed appropriately without being supported on a support substrate.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
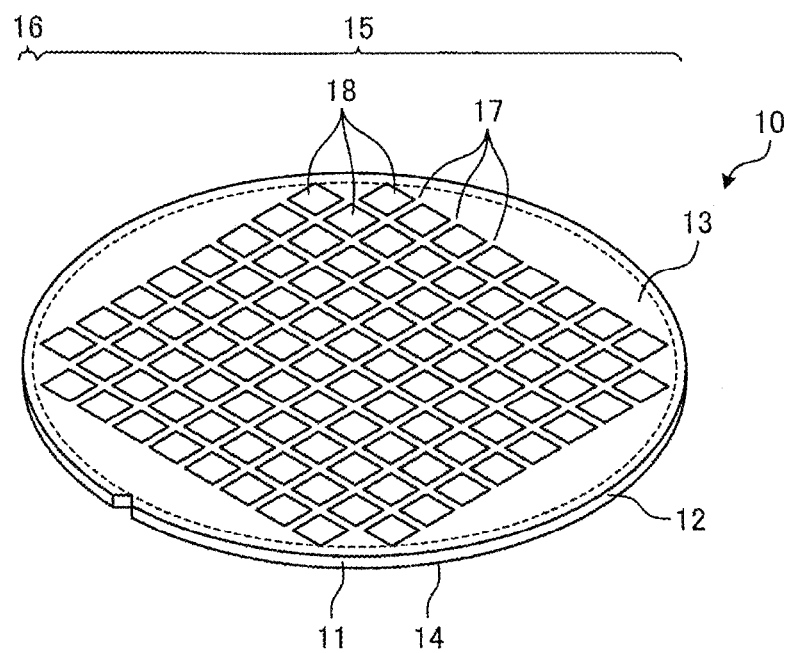
FIG. 1 is a perspective view illustrating by way of example a face side of a wafer.

Preferred embodiments of the present invention will be described in detail hereinbelow with reference to the accompanying drawings. The present invention is not limited to the details of the embodiments described below. The components described below cover those which could easily be anticipated by those skilled in the art and those which are essentially identical to those described below. Furthermore, the arrangements described below can be combined in appropriate manners. Various omissions, replacements, or changes of the arrangements may be made without departing from the scope of the present invention. In the description below, those components that are identical to each other are denoted by identical reference characters.

Figure 2:
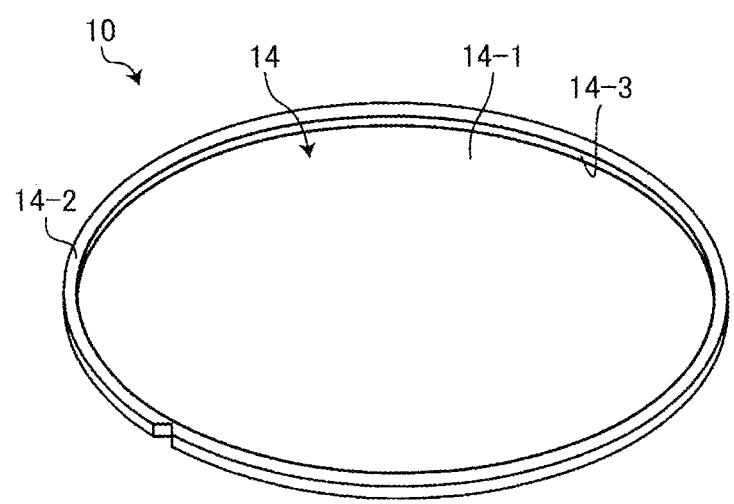
FIG. 2 is a perspective view illustrating by way of example a reverse side of the wafer illustrated in FIG. 1.
Figure 3:
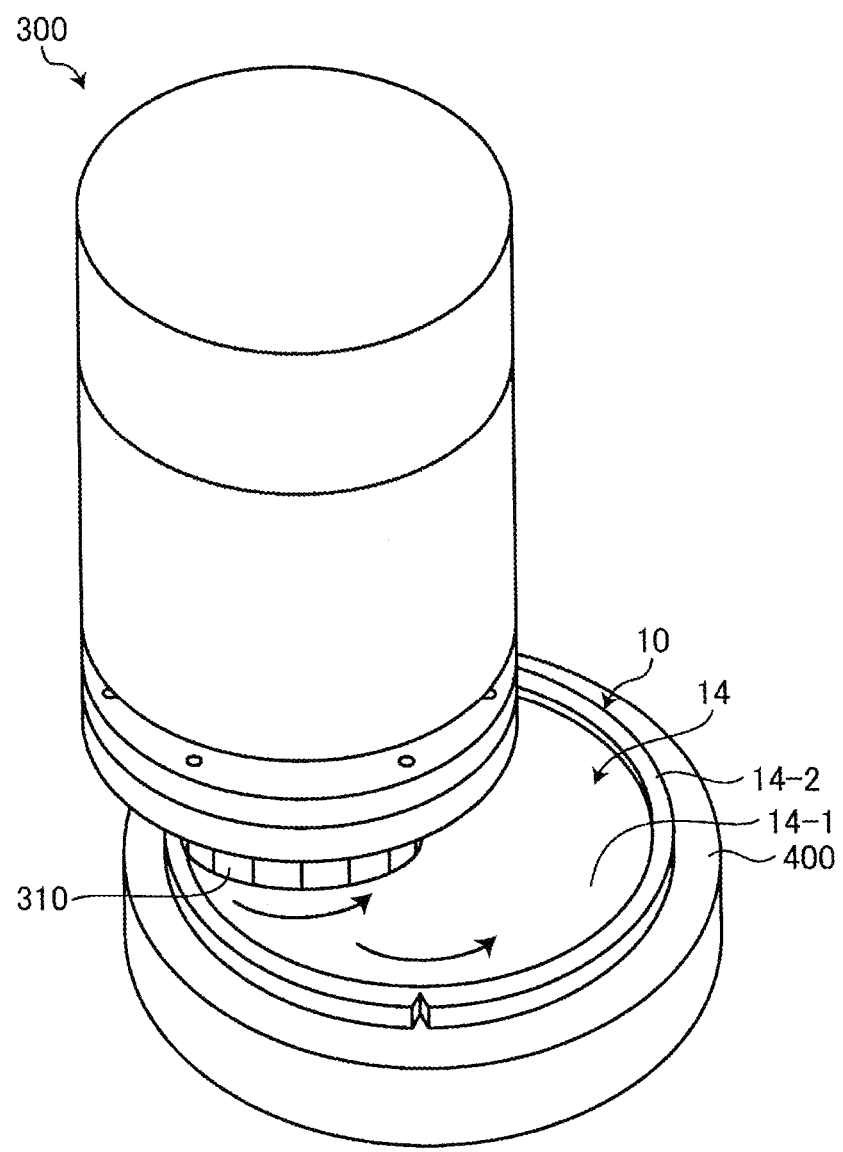
FIG. 3 is a perspective view illustrating by way of example a grinding unit for grinding the reverse side of the wafer.

A wafer processing apparatus and a wafer processing method according to a first embodiment of the present invention will be described in detail below with reference to the drawings. FIG. 1 illustrates by way of example in perspective a face side of a wafer. FIG. 2 illustrates by way of example in perspective a reverse side of the wafer illustrated in FIG. 1. FIG. 3 illustrates by way of example in perspective a grinding unit for grinding the reverse side of the wafer.

The wafer, denoted by 10 in FIGS. 1 and 2, represents a semiconductor wafer or an optical device wafer, for example, shaped as a circular plate including a substrate 11 made of silicon (Si), sapphire ($Al_2O_3$), gallium arsenide (GaAs), or silicon carbide (SiC). The substrate 11 has an outer circumferential edge 12. According to the present embodiment, the wafer 10 will be described as a silicon wafer below.

As illustrated in FIG. 1, the wafer 10 includes a device region 15 and an outer circumferential surplus region 16 around the device region 15 on a face side 13 of the substrate 11. The device region 15 has a grid of projected dicing lines 17 established on the face side 13 and a plurality of devices 18 constructed in respective areas demarcated on the face side 13 by the projected dicing lines 17. The outer circumferential surplus region 16 that extends along the outer circumferential edge 12 surrounds the device region 15 entirely therearound and is free of the devices 18. Each of the devices 18 may be an IC, an LSI circuit, an image sensor such as a charge-coupled device (CCD) or a complementary metal oxide semiconductor (CMOS), a microelectromechanical system (MEMS), or a semiconductor memory (semiconductor storage device), for example.

As illustrated in FIG. 2, the wafer 10 has a reverse side 14 opposite the face side 13. The reverse side 14 has a central circular recess 14-1 and an annular ridge 14-2 around the circular recess 14-1, with an annular step 14-3 present between the circular recess 14-1 and the annular ridge 14-2. The annular ridge 14-2 extends along the outer circumferential edge 12. The circular recess 14-1 generally underlies the device region 15, whereas the annular ridge 14-2 generally underlies the outer circumferential surplus region 16. Therefore, the annular step 14-3 may be referred to as being present between the device region 15 and the outer circumferential surplus region 16. The face side 13 of the wafer 10 lies flatwise over the device region 15 and the outer circumferential surplus region 16. According to the present embodiment, the wafer 10 has the central circular recess 14-1 and the annular ridge 14-2 on the reverse side 14. However, both the face side 13 and the reverse side 14 of the wafer 10 may lie flatwise.

As illustrated in FIG. 3, the reverse side 14 of the wafer 10 over the device region 15 is ground by a grinding unit 300 of a known grinding apparatus, not depicted, forming the circular recess 14-1 in the reverse side 14 over the device region 15 and leaving the annular ridge 14-2 on the reverse side 14 over the outer circumferential surplus region 16. Therefore, the wafer 10 is thicker in the outer circumferential surplus region 16 than in the device region 15. The wafer 10 thus configured is referred to as what is generally called a TAIKO (registered trademark of Disco Corporation) wafer.

The circular recess 14-1 is positioned in a region of the reverse side 14 that is aligned with the device region 15 thicknesswise across the wafer 10. The annular ridge 14-2 is positioned in a region of the reverse side 14 that is aligned with the outer circumferential surplus region 16 thickness-wise across the wafer 10. In the present description, the region of the reverse side 14 that is aligned with the device region 15 thicknesswise across the wafer 10 will be referred to as the "device region 15 of the reverse side 14," and the region of the reverse side 14 that is aligned with the outer circumferential surplus region 16 thicknesswise across the wafer 10 will be referred to as the "outer circumferential surplus region 16 of the reverse side 14," wherever necessary.

The grinding apparatus includes a holding table 400 for holding the wafer 10 on an upper holding surface thereof with the reverse side 14 exposed upwardly. The grinding unit 300 is positioned above the holding table 400 and includes a grinding pad 310 shaped as a circular plate that is mounted on the lower end of a spindle, not depicted, that is rotatable about its vertical central axis by an electric motor, not depicted. When the grinding unit 300 is in operation, the grinding pad 310 grinds the reverse side 14 of the wafer 10 on the holding table 400, forming the circular recess 14-1 in the reverse side 14. Specifically, while the holding table 400 is being rotated about its vertical central axis, the grinding pad 310 is rotated about its vertical central axis and lowered by a grinding unit feed unit, not depicted, toward the holding table 400 into abrasive contact with the reverse side 14 of the wafer 10 on the rotating holding table 400, grinding the reverse side 14 to form the circular recess 14-1 in the reverse side 14. As the grinding pad 310 is continuously lowered, it deepens the circular recess 14-1 and continuously grinds the bottom surface of the circular recess 14-1 at a predetermined feed speed until the circular recess 14-1 reaches a predetermined depth. According to the present embodiment, the grinding unit 300 grinds the bottom surface of the circular recess 14-1 while being radially moved by a moving unit, not depicted, between a position where the grinding pad 310 has its outer edge overlapping the outer edge of the bottom of the circular recess 14-1 and a position where the grinding pad 310 has its outer edge overlapping the center of the bottom of the circular recess 14-1.

In order to increase the ease with which to handle the wafer 10 thinned down by grinding in subsequent steps, the wafer 10 is ground only in a central region of the reverse side 14, leaving an outer circumferential edge portion of the reverse side 14 as the annular ridge 14-2. The annular ridge 14-2 is effective to keep the ground wafer 10 rigid to a certain extent. However, if the wafer 10 has a relatively large diameter, then even the outer circumferential edge portion of the reverse side 14 unground and left as the annular ridge 14-2 is not effective enough to keep the ground wafer 10 rigid, possibly allowing the wafer 10 to warp or flex. If the ground wafer 10 is deformed due to warping or flexing because it is not rigid enough, then the wafer may tend to be damaged when it is delivered, stored into a cassette, or processed in subsequent steps. The wafer processing apparatus and the wafer processing method according to the present embodiment process the ground wafer 10 appropriately with no damage caused thereto without using a support substrate to support the wafer 10.

Figure 4:
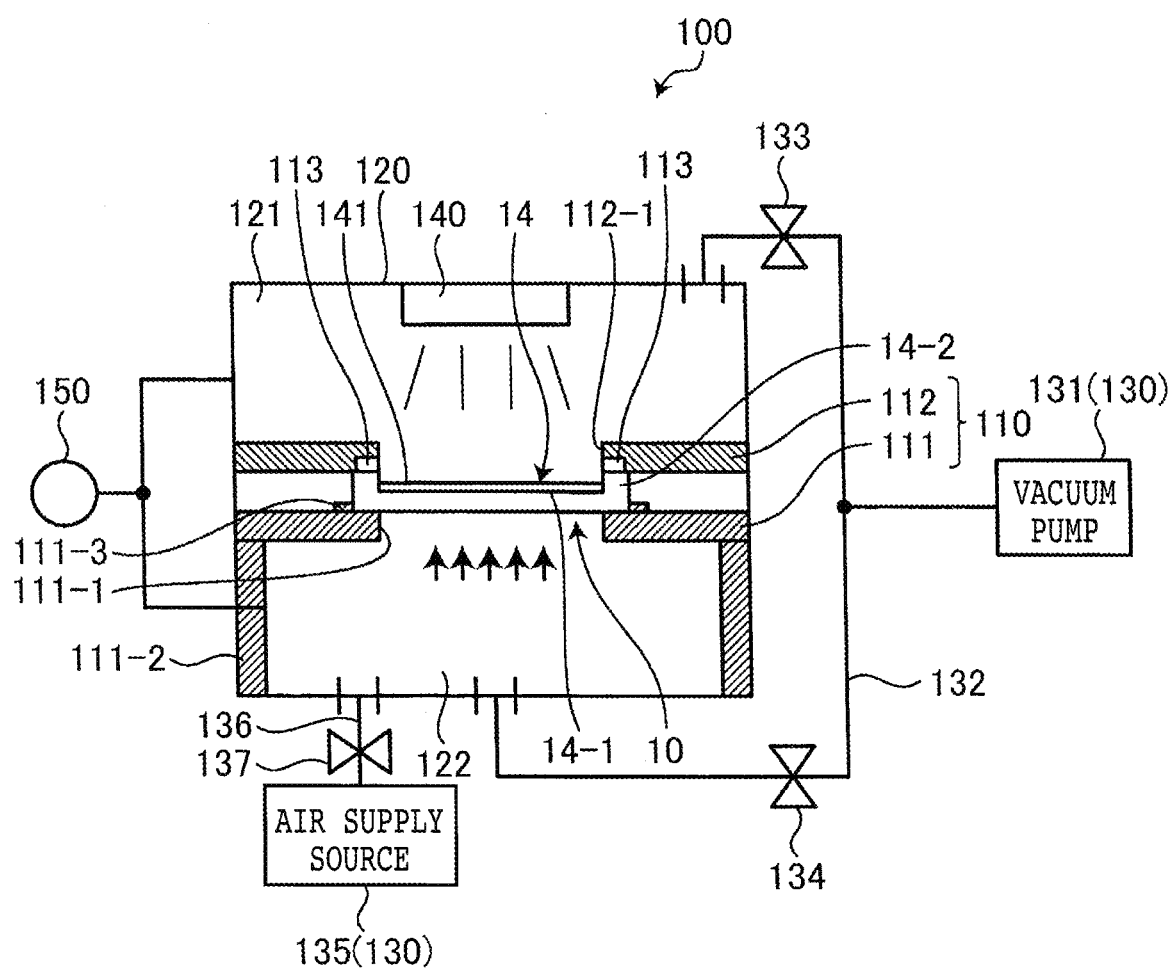
FIG. 4 is a cross-sectional view, partly in block form, illustrating by way of example a wafer processing apparatus according to a first embodiment of the present invention.

FIG. 4 illustrates by way of example in cross section, partly in block form, the wafer processing apparatus, denoted by 100, according to the first embodiment. As illustrated in FIG. 4, the wafer processing apparatus 100 refers to an apparatus for processing the wafer 10 that has on the face side 13 the device region 15 and the outer circumferential surplus region 16 around the device region 15. The wafer processing apparatus 100 includes a holder 110, a vacuum chamber 120, an evacuating unit 130, a processing unit 140, and a differential pressure meter 150.

The holder 110 is disposed in the vacuum chamber 120 for sandwiching the outer circumferential surplus region 16 of the wafer 10 between the face side 13 and the reverse side 14. The holder 110 has a support 111 and a presser 112. The support 111 defines a lower portion of the space in the vacuum chamber 120 as a lower compartment 122. The support 111 is shaped as a plate lying horizontally in the vacuum chamber 120 and having a circular opening 111-1 defined therein that is larger in diameter than the circular recess 14-1 of the wafer 10 but smaller in diameter than an outer edge of the annular ridge 14-2. According to the present embodiment, the support 111 is fixed in the vacuum chamber 120 at a predetermined height by a fixing member 111-2. The support 111 has a positioning member 111-3 on an upper surface thereof for positioning the wafer 10 on the upper surface of the support 111. The support 111 supports the wafer 10 thereon while the positioning member 111-3 is in contact with the outer circumferential edge 12 of the wafer 10.

The presser 112 is disposed in the vacuum chamber 120 for pressing the annular ridge 14-2 of the wafer 10 supported on the support 111 downwardly against the support 111. The presser 112 is spaced upwardly from the support 111, defining a space therebetween. The presser 112 defines an upper portion of the space in the vacuum chamber 120 as an upper compartment 121. As with the support 111, the presser 112 is shaped as a plate lying horizontally in the vacuum chamber 120 and having a circular opening 112-1 defined therein that is larger in diameter than the circular recess 14-1 of the wafer 10 and smaller in diameter than the outer edge of the annular ridge 14-2. The opening 112-1 in the presser 112 is positioned above and hence is open over the circular recess 14-1 of the wafer 10 that is supported on the support 111. The presser 112 includes an annular seal 113 made of an elastic material that is disposed on the edge of the presser 112 that defines the opening 112-1 and faces downwardly. When the presser 112 presses the annular ridge 14-2 downwardly, the seal 113 is elastically pressed against the annular ridge 14-2, thereby hermetically sealing the upper compartment 121. The space between the support 111 and the presser 112 is held in fluid communication with the lower compartment 122 of the vacuum chamber 120.

The upper compartment 121 and the lower compartment 122 may be defined in the vacuum chamber 120 by either one of the support 111 and the presser 112 of the holder 110. Therefore, one of the upper compartment 121 and the lower compartment 122 may not be required to divide the space in the vacuum chamber 120 and may be in the form of a plurality of plate-shaped segments angularly spaced at certain intervals, e.g., three segments spaced at 120° intervals.

The vacuum chamber 120 houses the holder 110 therein and has its space divided into the upper compartment 121 and the lower compartment 122 by the holder 110 and/or the presser 112, or more precisely by the holder 110 and/or the presser 112 and the wafer 10 held by the holder 110. According to the present embodiment, the vacuum chamber 120 is of a hollow cylindrical shape. According to the present invention, however, the vacuum chamber 120 is not limited to a hollow cylindrical shape. The vacuum chamber 120 can be evacuated to a vacuum therein by a vacuum pump 131 to keep the inside of the vacuum chamber 120 in a vacuum state.

The evacuating unit 130 evacuates the upper compartment 121 and the lower compartment 122 of the vacuum chamber 120. The evacuating unit 130 also keeps a positive pressure in the lower chamber 122 with respect to the upper chamber 121, thereby canceling out the flexing of the wafer 10 due to gravity. The positive pressure refers to a higher pressure in the lower compartment 122 than in the upper compartment 121. The pressure difference between the upper compartment 121 and the lower compartment 122 for canceling out the flexing of the wafer 10 due to gravity is set to a value that cancels out the flexing of the wafer 10 on the basis of the results of experiments and simulations conducted on the relation between the flexing of the wafer 10 and the canceling out of the flexing of the wafer 10, for example.

According to the present embodiment, the evacuating unit 130 includes the vacuum pump 131 that is fluidly connected to the upper compartment 121 and the lower compartment 122 through a suction pipe 132. The evacuating unit 130 can evacuate the space in the vacuum chamber 120 by drawing in gas, typically air, from the upper compartment 121 and the lower compartment 122 with the vacuum pump 131. The evacuating unit 130 includes a first valve 133 connected to the suction pipe 132 between the vacuum pump 131 and the upper compartment 121 and a second valve 134 connected to the suction pipe 132 between the vacuum pump 131 and the lower compartment 122. The evacuating unit 130 controls the opening and closing of the suction pipe 132 by opening and closing the first and second valves 133 and 134. The evacuating unit 130 also includes an air supply source 135 that is fluidly connected to the lower compartment 122 by a supply pipe 136. The evacuating unit 130 can increase the pressure in the lower compartment 122 by supplying air from the air supply source 135 through the supply pipe 136 to the lower compartment 122. The evacuating unit 130 further includes a third valve 137 connected to the supply pipe 136 between the air supply source 135 and the lower compartment 122. The evacuating unit 130 controls the opening and closing of the supply pipe 136 by opening and closing the third valve 137.

The processing unit 140 is disposed in the vacuum chamber 120 for processing the wafer 10 held by the holder 110 according to predetermined processes. The predetermined processes include a process for forming a metal film 141 in the circular recess 14-1 in the reverse side 14 of the wafer 10 and a process of forming a protective film in in the circular recess 14-1, for example. According to the present embodiment, the processing unit 140 is mounted on the ceiling of the upper compartment 121 in the vacuum chamber 120 so as to face the circular recess 14-1 of the wafer 10. According to the present embodiment, the processing unit 140 forms a metal film 141 on the reverse side 14 of the wafer 10 in the circular recess 14-1 by way of evaporation or sputtering. For example, the processing unit 140 includes a sputtering target of metal supported on an excitation member and electrically connected to a high-frequency power supply. The metal film 141 includes a multilayer film made of one or more metals of titanium, nickel, and gold.

The differential pressure meter 150 measures an air pressure difference between the upper compartment 121 and the lower compartment 122 of the vacuum chamber 120. Specifically, the differential pressure meter 150 measures an air pressure in the upper compartment 121 and an air pressure in the lower compartment 122 and calculates the difference between the measured air pressures. The differential pressure meter 150 then supplies the calculated air pressure difference to the wafer processing apparatus 100. Based on the supplied air pressure difference, the wafer processing apparatus 100 introduces air from the air supply source 135 to the lower compartment 122 to increase the pressure in the lower compartment 122, thereby developing a positive pressure in the lower chamber 122 with respect to the upper chamber 121 to cancel out the flexing of the wafer 10 due to gravity.

The structural and functional details of the wafer processing apparatus 100 according to the first embodiment have been described above. The structural and functional details of the wafer processing apparatus 100 described above with reference to FIG. 4 are by way of example only, and the wafer processing apparatus 100 according to the first embodiment is not limited to the described details. Rather, the structural and functional details of the wafer processing apparatus 100 according to the first embodiment can flexibly be changed or modified depending on actual specifications and operational needs.

Figure 5:
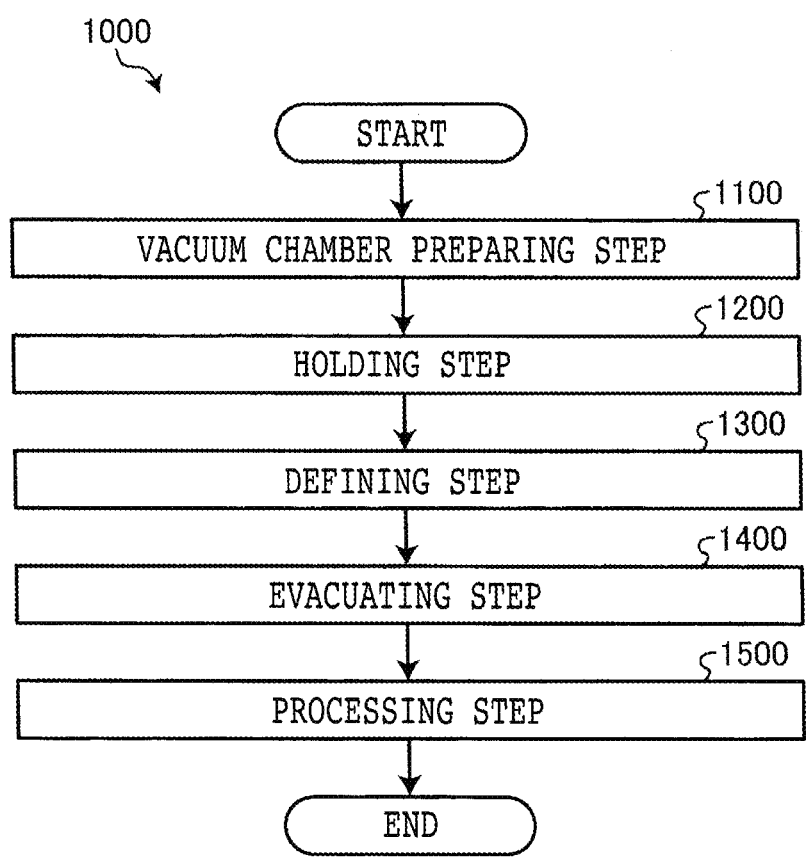
FIG. 5 is a flowchart illustrating the processing sequence of a wafer processing method to be carried out by the wafer processing apparatus.

The wafer processing method, denoted by 1000 in FIG. 5, according to the first embodiment that is to be carried out by the wafer processing apparatus 100 will be described below. FIG. 5 is a flowchart illustrating the processing sequence of the wafer processing method 1000 to be carried out by the wafer processing apparatus 100. As illustrated in FIG. 5, the wafer processing method 1000 includes a vacuum chamber preparing step 1100, a holding step 1200, a defining step 1300, an evacuating step 1400, and a processing step 1500. The wafer processing method 1000 refers to a method of processing the wafer 10 that has on the face side 13 the device region 15 and the outer circumferential surplus region 16 around the device region 15. The wafer processing method 1000 is carried out by the wafer processing apparatus 100.

First, the wafer processing apparatus 100 performs the vacuum chamber preparing step 1100 to prepare the vacuum chamber 120 having the holder 110 that sandwiches the outer circumferential surplus region 16 of the wafer 10 between the face side 13 and the reverse side 14 in the vacuum chamber 120, as illustrated in FIG. 4. Specifically, the holder 110 is accommodated in the vacuum chamber 120 for holding the wafer 10 that has been ground by the grinding unit 300, thereby preparing the vacuum chamber 120. After the vacuum chamber 120 has been prepared in the vacuum chamber preparing step 1100, the processing sequence illustrated in FIG. 5 goes to the holding step 1200.

The wafer processing apparatus 100 performs the holding step 1200 to hold the wafer 10 in the vacuum chamber 120 with the holder 110, as illustrated in FIG. 4. Specifically, the wafer 10 is placed on the support 111 such that the outer circumferential edge 12 of the wafer 10 is held against the positioning member 111-3 of the support 111 while the reverse side 14 of the wafer 10 is facing upwardly. Then, the presser 112 presses downwardly the annular ridge 14-2 of the wafer 10 supported on the support 111, so that the support 111 and the presser 112 sandwich the annular ridge 14-2 therebetween. The circular recess 14-1 in the reverse side 14 of the wafer 10 held by the holder 110 is now held in facing relation to the processing unit 140 in the upper compartment 121 of the vacuum chamber 120. After the wafer 10 has been thus positioned in the vacuum chamber 120 by the holder 110 in the holding step 1200, the processing sequence illustrated in FIG. 5 goes to the defining step 1300.

The wafer processing apparatus 100 performs the defining step 1300 to define the upper compartment 121 and the lower compartment 122 in the vacuum chamber 120 with the wafer 10 held by the holder 110, as illustrated in FIG. 4. After the upper compartment 121 and the lower compartment 122 have been defined in the vacuum chamber 120 in the defining step 1300, the processing sequence illustrated in FIG. 5 goes to the evacuating step 1400.

The wafer processing apparatus 100 performs the evacuating step 1400 to evacuate the upper compartment 121 and the lower compartment 122 and develop a positive pressure in the lower chamber 122 with respect to the upper chamber 121, thereby canceling out the flexing of the wafer 10 due to gravity, as illustrated in FIG. 4. Specifically, the evacuating unit 130 opens the first valve 133 and the second valve 134 and actuates the vacuum pump 131 to evacuate the upper compartment 121 and the lower compartment 122. At this time, since the wafer 10 tends to break if the pressure difference between the upper compartment 121 and the lower compartment 122 is unduly large, the evacuating unit 130 evacuates the upper compartment 121 and the lower compartment 122 simultaneously. Then, the evacuating unit 130 closes the first valve 133 and the second valve 134. On the basis of the air pressure difference measured between the upper compartment 121 and the lower compartment 122 by the differential pressure meter 150, the evacuating unit 130 opens the third valve 137 to introduce air from the air supply source 135 into the lower compartment 122 and increase the pressure in the lower compartment 122, thereby developing a positive pressure in the lower chamber 122 with respect to the upper chamber 121. When a positive pressure in the lower chamber 122 has been developed with respect to the upper chamber 121, the evacuating unit 130 closes the third valve 137 to stop introducing air from the air supply source 135 into the lower compartment 122. The positive pressure thus established in the lower chamber 122 with respect to the upper chamber 121 makes the pressure on the lower side, i.e., the face side 13, of the wafer 10 in the vacuum chamber 120 slightly higher than the pressure on the upper side, i.e., the reverse side 14, of the wafer 10, forcing the wafer 10 to slightly move upwardly in the vacuum chamber 120, i.e., toward the upper compartment 121. In this manner, the wafer 10 can be prevented from flexing downwardly due to gravity. After the evacuating step 1400 has been finished, the wafer processing apparatus 100 causes the processing sequence illustrated in FIG. 5 to go to the processing step 1500.

The wafer processing apparatus 100 performs the processing step 1500 to carry out a predetermined process on the wafer 10 with the processing unit 140 placed in the vacuum chamber 120, as illustrated in FIG. 4. According to the present embodiment, the wafer processing apparatus 100 forms a metal film 141 on the bottom surface of the circular recess 14-1 in the reverse side 14 of the wafer 10 with the processing unit 140. Specifically, the high-frequency power supply applies a high-frequency voltage to the sputtering target that has been magnetized by the excitation member, and introduces an argon gas from an argon gas source into the upper compartment 121, generating plasma in the upper compartment 121. Argon ions in the plasma impinge upon the sputtering target, expelling metal particles from the sputtering target. The processing unit 140 is operated to cause the metal particles to be deposited on the bottom surface of the circular recess 14-1 in the reverse side 14 of the wafer 10, thereby forming a metal film 141 in the circular recess 14-1. When the processing step 1500 has been finished, the wafer processing apparatus 100 causes the wafer processing method 1000 illustrated in FIG. 5 to come to an end.

The wafer 10 thus processed by the wafer processing apparatus 100 is taken out of the wafer processing apparatus 100 and placed on a holding table, not depicted, such that the metal film 141 on the reverse side 14 is held in contact with the holding table. The holding table is electrically connected to the ground, so that the wafer 10 is electrically connected to the ground via the metal film 141. Then, the devices 18 on the face side 13 of the wafer 10 are tested for their electric characteristics by a probe, not depicted, contacting the devices 18.

As described above, according to the wafer processing apparatus 100 and the wafer processing method 1000, when the wafer 10 is held by the holder 110 housed in the vacuum chamber 120, a positive pressure can be developed in the lower compartment 122 below the wafer 10 with respect to the upper compartment 121 above the wafer 10. Inasmuch as the wafer 10 is slightly pushed upwardly toward the upper compartment 121 by the pressure difference between the upper compartment 121 and the lower compartment 122, the wafer 10 can be prevented from flexing downwardly due to gravity. As a result, according to the wafer processing apparatus 100 and the wafer processing method 1000, since the wafer 10 can be processed appropriately without being supported on a support substrate, the wafer 10 can be handled with increased ease.

The wafer processing apparatus 100 and the wafer processing method 1000 can form the metal film 141 on the reverse side 14 of the wafer 10 over the device region 15, i.e., the device region 15 of the reverse side 14 of the wafer 10. According to the wafer processing apparatus 100 and the wafer processing method 1000, as the wafer 10 can be prevented from flexing due to gravity in the vacuum chamber 120, the metal film 141 can appropriately be formed on the wafer 10 that has been thinned down by grinding.

According to the wafer processing apparatus 100 and the wafer processing method 1000, when the wafer 10 that has the circular recess 14-1 defined in the reverse side 14 of the device region 15 and the annular ridge 14-2 disposed in the outer circumferential surplus region 16 and surrounding the device region 15 is housed in the vacuum chamber 120, the device region 15 that is thinned down by the circular recess 14-1 can be prevented from flexing downwardly due to gravity. According to the wafer processing apparatus 100 and the wafer processing method 1000, as the device region 15 that remains flat can be properly processed, the wafer 10 can be handled and processed without being supported on a support substrate.

Figure 6:
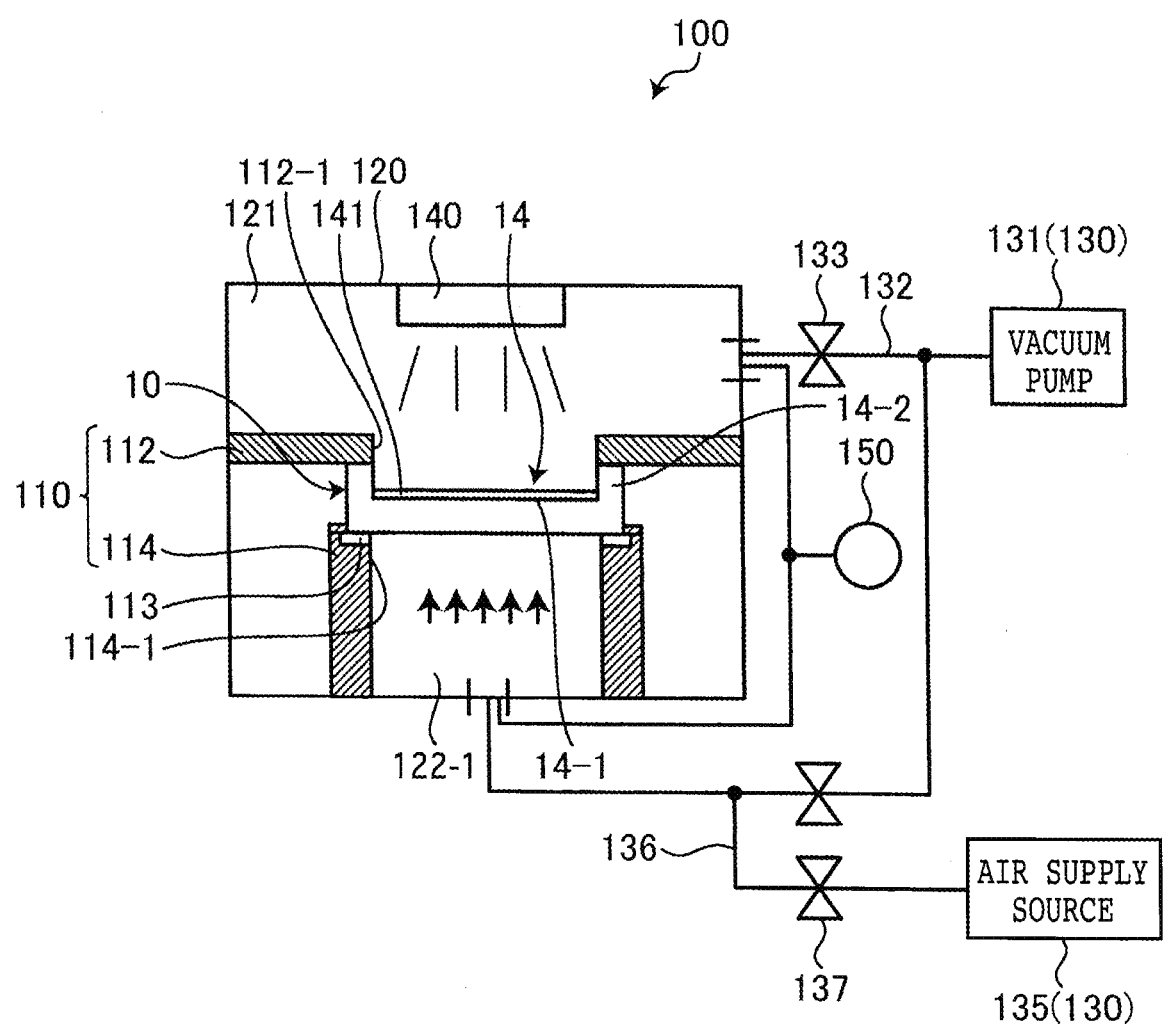
FIG. 6 is a cross-sectional view, partly in block form, illustrating by way of example a wafer processing apparatus according to a second embodiment of the present invention.

A wafer processing apparatus and a wafer processing method according to a second embodiment of the present invention will be described in detail below with reference to the drawings. FIG. 6 illustrates by way of example in cross section, partly in block form, the wafer processing apparatus, denoted by 100, according to the second embodiment. Those parts of the wafer processing apparatus 100 according to the second embodiment and wafer processing apparatuses according to other embodiments that are identical to those described above are denoted by identical reference characters, and may not be described in detail below.

As with the wafer processing apparatus 100 according to the first embodiment, the wafer processing apparatus 100 according to the second embodiment illustrated in FIG. 6 refers to an apparatus for processing the wafer 10 that has on the face side 13 the device region 15 and the outer circumferential surplus region 16 around the device region 15. The wafer processing apparatus 100 according to the second embodiment includes a holder 110, a vacuum chamber 120, an evacuating unit 130, a processing unit 140, and a differential pressure meter 150.

The holder 110 is disposed in the vacuum chamber 120 for sandwiching the outer circumferential surplus region 16 of the wafer 10 between the face side 13 and the reverse side 14. The holder 110 has a support 114 and a presser 112. The support 114 is shaped as a hollow tubular member whose inside diameter is smaller than the diameter of the wafer 10. According to the present embodiment, the inside diameter of the support 114 is substantially the same as the diameter of the circular recess 14-1 in the reverse side 14 of the wafer 10. The support 114 defines a lower portion of the space in the vacuum chamber 120 below the device region 15 of the wafer 10 under the circular recess 14-1 thereof as a lower compartment 122-1. Stated otherwise, the lower compartment 122-1 in the vacuum chamber 120 according to the second embodiment has a smaller inner space than the lower compartment 122 in the vacuum chamber 120 according to the first embodiment.

The support 114 has an outside diameter larger than the outside diameter of the annular ridge 14-2 of the wafer 10, and has a wafer rest 114-1 on its upper end for placing the wafer 10 thereon. The wafer rest 114-1 is shaped as a step for supporting thereon the wafer 10 such that the wafer 10 supported on the step covers the lower compartment 122-1 in the support 114. The support 114 has a ring-shaped seal 113 disposed on the step of the wafer rest 114-1 for sealing the lower compartment 122-1 by being held in contact with the wafer 10 placed on the wafer rest 114-1.

The presser 112 is disposed in the vacuum chamber 120 for pressing the annular ridge 14-2 of the wafer 10 supported on the support 114 downwardly against the support 114. The presser 112 is spaced upwardly from the support 114. The presser 112 defines an upper portion of the space in the vacuum chamber 120 as an upper compartment 121. The presser 112 is shaped as a plate having a circular opening 112-1 defined therein that is larger in diameter than the circular recess 14-1 of the wafer 10 and smaller in diameter than the outer edge of the annular ridge 14-2. The opening 112-1 in the presser 112 is positioned above and hence is open over the circular recess 14-1 of the wafer 10 that is supported on the support 114.

According to the second embodiment, since the support 114 of the holder 110 defines the lower compartment 122-1, the presser 112 may not be required to divide the space in the vacuum chamber 120 and may be in the form of a plurality of plate-shaped segments angularly spaced at certain intervals, e.g., three segments spaced at 120° intervals, for pressing the annular ridge 14-2 of the wafer 10 downwardly.

The structural and functional details of the wafer processing apparatus 100 according to the second embodiment have been described above. The structural and functional details of the wafer processing apparatus 100 described above with reference to FIG. 6 are by way of example only, and the wafer processing apparatus 100 according to the second embodiment is not limited to the described details. Rather, the structural and functional details of the wafer processing apparatus 100 according to the second embodiment can flexibly be changed or modified depending on actual specifications and operational needs.

The wafer processing method, denoted by 1000 in FIG. 5, according to the second embodiment that is to be carried out by the wafer processing apparatus 100 according to the second embodiment will be described below. As with the wafer processing method 1000 according to the first embodiment, the wafer processing method 1000 according to the second embodiment includes the vacuum chamber preparing step 1100, the holding step 1200, the defining step 1300, the evacuating step 1400, and the processing step 1500, as illustrated in FIG. 5.

First, the wafer processing apparatus 100 performs the vacuum chamber preparing step 1100 to prepare the vacuum chamber 120 having the holder 110 that sandwiches the outer circumferential surplus region 16 of the wafer 10 between the face side 13 and the reverse side 14 in the vacuum chamber 120, as illustrated in FIG. 6. Specifically, the holder 110 is accommodated in the vacuum chamber 120 for holding the wafer 10 that has been ground by the grinding unit 300, thereby preparing the vacuum chamber 120. After the vacuum chamber 120 has been prepared in the vacuum chamber preparing step 1100, the wafer processing apparatus 100 causes the processing sequence illustrated in FIG. 5 to go to the holding step 1200.

The wafer processing apparatus 100 performs the holding step 1200 to hold the wafer 10 in the vacuum chamber 120 with the holder 110, as illustrated in FIG. 6. Specifically, the wafer 10 is placed on the support 114 such that the outer circumferential edge 12 of the wafer 10 is held against the wafer rest 114-1 of the support 114 while the reverse side 14 of the wafer 10 is facing upwardly. Then, the presser 112 presses downwardly the annular ridge 14-2 of the wafer 10 supported on the support 114, so that the support 114 and the presser 112 sandwich the annular ridge 14-2 therebetween. Thus, in the wafer processing apparatus 100, the circular recess 14-1 in the reverse side 14 of the wafer 10 held by the holder 110 is now held in facing relation to the processing unit 140 in the upper compartment 121 of the vacuum chamber 120. After the wafer 10 has been thus positioned in the vacuum chamber 120 by the holder 110 in holding step 1200, the wafer processing apparatus 100 causes the processing sequence illustrated in FIG. 5 to go to the defining step 1300.

The wafer processing apparatus 100 performs the defining step 1300 to define the upper compartment 121 and the lower compartment 122 in the vacuum chamber 120 with the wafer 10 held by the holder 110, as illustrated in FIG. 6. After the upper compartment 121 and the lower compartment 122 have been defined in the vacuum chamber 120 in the defining step 1300, the wafer processing apparatus 100 causes the processing sequence illustrated in FIG. 5 to go to the evacuating step 1400.

The wafer processing apparatus 100 performs the evacuating step 1400 to evacuate the upper compartment 121 and the lower compartment 122 and develop a positive pressure in the lower chamber 122 with respect to the upper chamber 121, thereby canceling out the flexing of the wafer 10 due to gravity, as illustrated in FIG. 6. Specifically, the evacuating unit 130 opens the first valve 133 and the second valve 134 and actuates the vacuum pump 131 to evacuate the upper compartment 121 and the lower compartment 122 simultaneously. At this time, since the wafer 10 tends to break if the pressure difference between the upper compartment 121 and the lower compartment 122 is unduly large, the evacuating unit 130 evacuates the upper compartment 121 and the lower compartment 122 simultaneously. Then, the evacuating unit 130 closes the first valve 133 and the second valve 134. On the basis of the air pressure difference measured between the upper compartment 121 and the lower compartment 122 by the differential pressure meter 150, the evacuating unit 130 opens the third valve 137 to introduce air from the air supply source 135 into the lower compartment 122 to increase the pressure in the lower compartment 122, thereby developing a positive pressure in the lower chamber 122 with respect to the upper chamber 121. When a positive pressure in the lower chamber 122 has been developed with respect to the upper chamber 121, the evacuating unit 130 closes the third valve 137 to stop introducing air from the air supply source 135 into the lower compartment 122. The positive pressure thus established in the lower chamber 122 with respect to the upper chamber 121 makes the pressure on the lower side, i.e., the face side 13, of the wafer 10 in the vacuum chamber 120 slightly higher than the pressure on the upper side, i.e., the reverse side 14, of the wafer 10, forcing the wafer 10 to slightly move upwardly in the vacuum chamber 120, i.e., toward the upper compartment 121. In this manner, the wafer 10 can be prevented from flexing downwardly due to gravity. After the evacuating step 1400 has been finished, the wafer processing apparatus 100 causes the processing sequence illustrated in FIG. 5 to go to the processing step 1500.

The wafer processing apparatus 100 performs the processing step 1500 to carry out a predetermined process on the wafer 10 with the processing unit 140 placed in the vacuum chamber 120, as illustrated in FIG. 6. According to the present embodiment, the wafer processing apparatus 100 forms a metal film 141 on the bottom surface of the circular recess 14-1 in the reverse side 14 of the wafer 10 with the processing unit 140. Specifically, the high-frequency power supply applies a high-frequency voltage to the sputtering target that has been magnetized by the excitation member, and introduces an argon gas from an argon gas source into the upper compartment 121, generating plasma in the upper compartment 121. Argon ions in the plasma impinge upon the sputtering target, expelling metal particles from the sputtering target. The metal particles are deposited on the bottom surface of the circular recess 14-1, thereby forming a metal film 141 in the circular recess 14-1. When the processing step 1500 has been finished, the wafer processing apparatus 100 causes the processing sequence illustrated in FIG. 5 to come to an end.

As described above, with the wafer processing apparatus 100 and the wafer processing method 1000 according to the second embodiment, when the wafer 10 is held by the holder 110 housed in the vacuum chamber 120, a positive pressure can be developed below the wafer 10 with respect to above the wafer 10. Inasmuch as the wafer 10 is slightly pushed upwardly toward the upper compartment 121 by the pressure difference between the upper compartment 121 and the lower compartment 122, the wafer 10 can be prevented from flexing downwardly due to gravity. Furthermore, as the lower compartment 122-1 in the vacuum chamber 120 is a smaller space than the lower compartment 122 according to the first embodiment, a positive pressure can easily be developed in the lower compartment 122 below the wafer 10 with respect to the upper compartment 121 above the wafer 10. As a result, since the wafer 10 can be processed appropriately without being supported on a support substrate, the wafer 10 can be handled with increased ease. The wafer processing apparatus 100 and the wafer processing method 1000 according to the second embodiment offer the same advantages as the wafer processing apparatus 100 and the wafer processing method 1000 according to the first embodiment.

Figure 7:
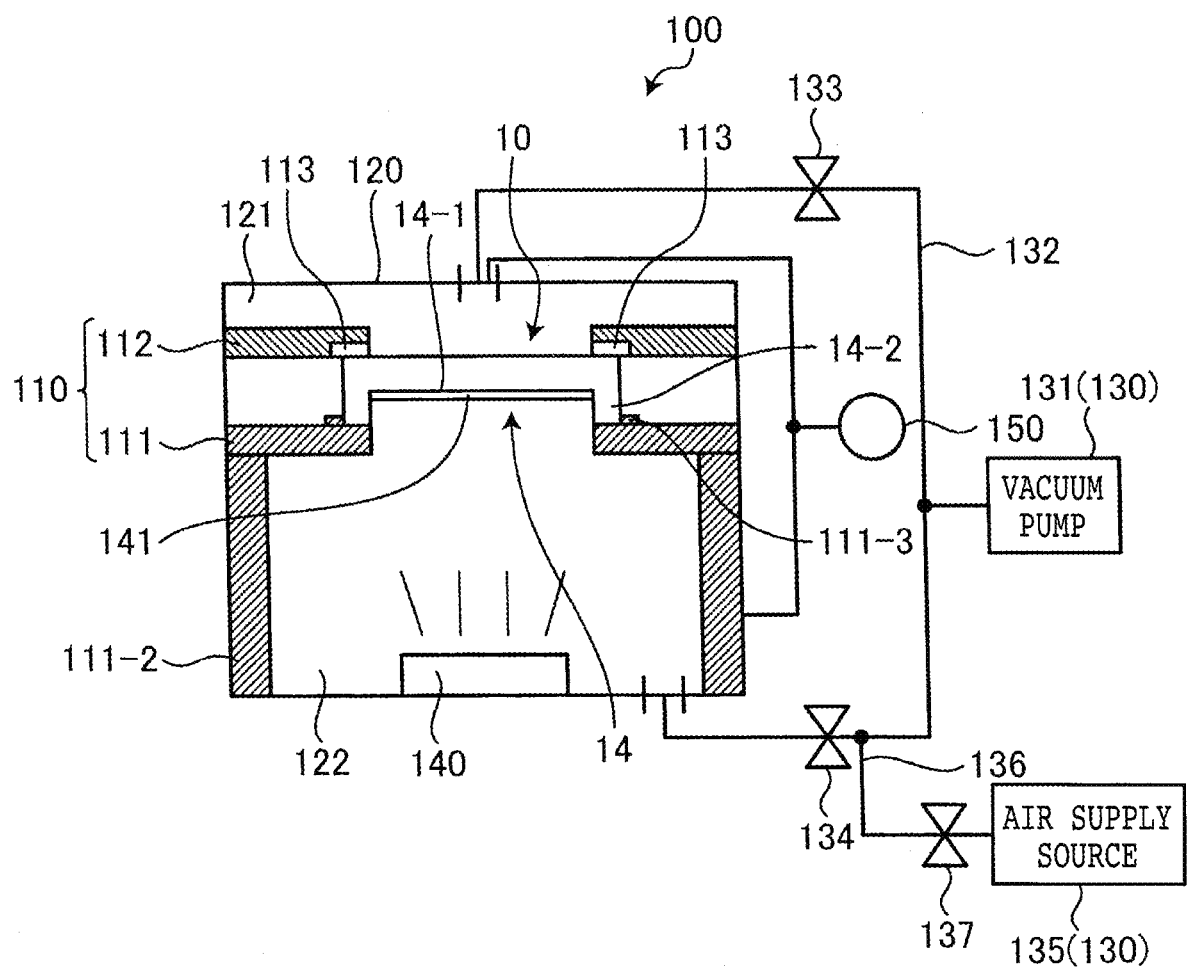
FIG. 7 is a cross-sectional view, partly in block form, illustrating by way of example a wafer processing apparatus according to a third embodiment of the present invention.

A wafer processing apparatus and a wafer processing method according to a third embodiment of the present invention will be described in detail below with reference to the drawings. FIG. 7 illustrates by way of example in cross section, partly in block form, the wafer processing apparatus, denoted by 100, according to the third embodiment. As with the wafer processing apparatus 100 according to the first embodiment, the wafer processing apparatus 100 according to the third embodiment illustrated in FIG. 7 refers to an apparatus for processing the wafer 10 that has on the face side 13 the device region 15 and the outer circumferential surplus region 16 around the device region 15. The wafer processing apparatus 100 according to the third embodiment includes a holder 110, a vacuum chamber 120, an evacuating unit 130, a processing unit 140, and a differential pressure meter 150.

The holder 110 is disposed in the vacuum chamber 120 for sandwiching the outer circumferential surplus region 16 of the wafer 10 between the face side 13 and the reverse side 14. According to the third embodiment, the holder 110 is identical in structure to the holder 110 according to the first embodiment, but is different therefrom in that the holder 110 sandwiches the annular ridge 14-2 of the wafer 10 with the circular recess 14-1 facing toward the bottom of the vacuum chamber 120.

The processing unit 140 is disposed in the vacuum chamber 120 for processing the wafer 10 held by the holder 110 according to predetermined processes. According to the third embodiment, the processing unit 140 is disposed on the bottom of the vacuum chamber 120 in the lower compartment 122 in facing relation to the circular recess 14-1 of the wafer 10. The processing unit 140 is arranged to form a metal film 141 on the reverse side 14 of the wafer 10 in the circular recess 14-1 by way of evaporation or sputtering. For example, the processing unit 140 includes a sputtering target of metal supported on an excitation member and electrically connected to a high-frequency power supply.

The structural and functional details of the wafer processing apparatus 100 according to the third embodiment have been described above. The structural and functional details of the wafer processing apparatus 100 described above with reference to FIG. 7 are by way of example only, and the wafer processing apparatus 100 according to the third embodiment is not limited to the described details. Rather, the structural and functional details of the wafer processing apparatus 100 according to the third embodiment can flexibly be changed or modified depending on actual specifications and operational needs.

The wafer processing method, denoted by 1000 in FIG. 5, according to the third embodiment that is to be carried out by the wafer processing apparatus 100 according to the third embodiment will be described below. As with the wafer processing method 1000 according to the first embodiment, the wafer processing method 1000 according to the third embodiment includes the vacuum chamber preparing step 1100, the holding step 1200, the defining step 1300, the evacuating step 1400, and the processing step 1500, as illustrated in FIG. 5.

First, the wafer processing apparatus 100 performs the vacuum chamber preparing step 1100 to prepare the vacuum chamber 120 having the holder 110 that sandwiches the outer circumferential surplus region 16 of the wafer 10 between the face side 13 and the reverse side 14 in the vacuum chamber 120, as illustrated in FIG. 7. Specifically, the holder 110 is accommodated in the vacuum chamber 120 for holding the wafer 10 that has been ground by the grinding unit 300, thereby preparing the vacuum chamber 120. After the vacuum chamber 120 has been prepared in the vacuum chamber preparing step 1100, the wafer processing apparatus 100 causes the processing sequence illustrated in FIG. 5 to go to the holding step 1200.

The wafer processing apparatus 100 performs the holding step 1200 to hold the wafer 10 in the vacuum chamber 120 with the holder 110, as illustrated in FIG. 7. Specifically, the wafer 10 is placed on the support 111 such that the outer circumferential edge 12 of the wafer 10 is held against the positioning member 111-3 of the support 111 while the reverse side 14 of the wafer 10 is facing downwardly. Then, the presser 112 presses downwardly the annular ridge 14-2 of the wafer 10 supported on the support 111, so that the support 111 and the presser 112 sandwich the annular ridge 14-2 therebetween. The circular recess 14-1 in the reverse side 14 of the wafer 10 held by the holder 110 is now held in facing relation to the processing unit 140 on the bottom of the vacuum chamber 120 in the upper compartment 121. After the wafer 10 has been thus positioned in the vacuum chamber 120 by the holder 110 in holding step 1200, the wafer processing apparatus 100 causes the processing sequence illustrated in FIG. 5 to go to the defining step 1300.

The wafer processing apparatus 100 performs the defining step 1300 to define the upper compartment 121 and the lower compartment 122 in the vacuum chamber 120 with the wafer 10 held by the holder 110, as illustrated in FIG. 7. After the upper compartment 121 and the lower compartment 122 have been defined in the vacuum chamber 120 in the defining step 1300, the wafer processing apparatus 100 causes the processing sequence illustrated in FIG. 5 to go to the evacuating step 1400.

The wafer processing apparatus 100 performs the evacuating step 1400 to evacuate the upper compartment 121 and the lower compartment 122 and develop a positive pressure in the lower compartment 122 with respect to the upper compartment 121, thereby cancelling out the flexing of the wafer 10 due to gravity, as illustrated in FIG. 7. Specifically, the evacuating unit 130 opens the first valve 133 and the second valve 134 and actuates the vacuum pump 131 to evacuate the upper compartment 121 and the lower compartment 122 simultaneously. At this time, since the wafer 10 tends to break if the pressure difference between the upper compartment 121 and the lower compartment 122 is unduly large, the evacuating unit 130 evacuates the upper compartment 121 and the lower compartment 122 simultaneously. Then, the evacuating unit 130 closes the first valve 133 and the second valve 134. On the basis of the air pressure difference measured between the upper compartment 121 and the lower compartment 122 by the differential pressure meter 150, the evacuating unit 130 opens the second valve 134 and the third valve 137 to introduce air from the air supply source 135 into the lower compartment 122 to increase the pressure in the lower compartment 122, thereby developing a positive pressure in the lower chamber 122 with respect to the upper chamber 121. When a positive pressure in the lower chamber 122 has been developed with respect to the upper chamber 121, the evacuating unit 130 closes the second valve 134 and the third valve 137 to stop introducing air from the air supply source 135 into the lower compartment 122. The positive pressure thus established in the lower chamber 122 with respect to the upper chamber 121 makes the pressure on the lower side, i.e., the reverse side 14, of the wafer 10 in the vacuum chamber 120 slightly higher than the pressure on the upper side, i.e., the face side 13, of the wafer 10, forcing the wafer 10 to slightly move upwardly in the vacuum chamber 120, i.e., toward the upper compartment 121. In this manner, the wafer 10 can be prevented from flexing downwardly due to gravity. After the evacuating step 1400 has been finished, the wafer processing apparatus 100 causes the processing sequence illustrated in FIG. 5 to go to the processing step 1500.

The wafer processing apparatus 100 performs the processing step 1500 to carry out a predetermined process on the wafer 10 with the processing unit 140 disposed in the lower compartment 122 of the vacuum chamber 120, as illustrated in FIG. 7. According to the present embodiment, the wafer processing apparatus 100 forms a metal film 141 on the bottom surface of the circular recess 14-1 in the reverse side 14 of the wafer 10 with the processing unit 140. Specifically, the high-frequency power supply applies a high-frequency voltage to the sputtering target that has been magnetized by the excitation member, and introduces an argon gas from an argon gas source into the lower compartment 122, generating plasma in the lower compartment 122. Argon ions in the plasma impinge upon the sputtering target, expelling metal particles from the sputtering target. The metal particles are deposited on the bottom surface of the circular recess 14-1, thereby forming a metal film 141 in the circular recess 14-1. When the processing step 1500 has been finished, the wafer processing apparatus 100 causes the processing sequence illustrated in FIG. 5 to come to an end.

As described above, with the wafer processing apparatus 100 and the wafer processing method 1000 according to the third embodiment, when the wafer 10 is held by the holder 110 housed in the vacuum chamber 120, a positive pressure can be developed in the lower compartment 122 below the wafer 10 with respect to the upper compartment 121 above the wafer 10. Inasmuch as the wafer 10 is slightly pushed upwardly toward the upper compartment 121 by the pressure difference between the upper compartment 121 and the lower compartment 122, the wafer 10 can be prevented from flexing downwardly due to gravity. As a result, since the wafer 10 can be processed appropriately without being supported on a support substrate, the wafer 10 can be handled with increased ease. The wafer processing apparatus 100 and the wafer processing method 1000 according to the third embodiment offer the same advantages as the wafer processing apparatus 100 and the wafer processing method 1000 according to the first embodiment.

According to each of the above embodiments, the wafer processing method 1000 includes the vacuum chamber preparing step 1100, the holding step 1200, the defining step 1300, the evacuating step 1400, and the processing step 1500. However, the present invention is not limited to those steps of the method. The wafer processing method 1000 may additionally include a grinding step of grinding the bottom of the circular recess 14-1 and the annular ridge 14-2 on the reverse side 14 of the wafer 10 with the grinding unit 300 as a process prior to the vacuum chamber preparing step 1100. Alternatively, the wafer processing method 1000 may include a grinding step of grinding the bottom of the circular recess 14-1 and the annular ridge 14-2 in the reverse side 14 of the wafer 10 with the grinding unit 300 as a process within the vacuum chamber preparing step 1100.

The wafer processing apparatus 100 and the wafer processing method 1000 have been described to process the wafer 10 having the circular recess 14-1 and the annular ridge 14-2 on the reverse side 14. However, the present invention is not limited to such details. Rather, the wafer processing apparatus 100 and the wafer processing method 1000 may be applied to plate-shaped wafers that are free of the circular recess 14-1 and the annular ridge 14-2 and that are liable to flex due to gravity, thereby achieving the same advantages as those described in the above embodiments. Furthermore, in either one of the above embodiments, a ring-shaped seal may be fixed to a radially inner side of the positioning member 111-3 for defining the upper compartment 121 and the lower compartment 122 as separating more reliably from each other.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing apparatus for processing a wafer having a face side including a device region defining a circular recess and having a plurality of devices and an outer circumferential surplus region around the recess of the device region, the wafer processing apparatus comprising:
    a holder including a presser and a support, wherein the holder holds the wafer by sandwiching the outer circumferential surplus region of the wafer between the presser and the support, the presser and the support each including a central through opening;
    a vacuum chamber which houses the holder therein such that the wafer held by the holder defines an upper compartment and a lower compartment in the vacuum chamber, wherein the upper compartment is separated from the lower compartment by the holder;
    an evacuating unit which evacuates the upper compartment and the lower compartment and develops a positive pressure in the lower compartment with respect to the upper compartment to cancel out flexing of the wafer held by the holder due to gravity; and
    a processing unit which is disposed in the vacuum chamber to perform a predetermined process on the wafer held by the holder.

2. The wafer processing apparatus according to claim 1, wherein the processing unit forms a metal film on the reverse side of the wafer in alignment with the device region.

3. The wafer processing apparatus according to claim 1, wherein the wafer has an annular ridge disposed on the outer circumferential surplus region and surrounding the circular recess.

4. A wafer processing method for processing a wafer having a face side including a device region defining a circular recess and having a plurality of devices and an outer circumferential surplus region around the recess of the device region, the method comprising:
    a vacuum chamber preparing step of preparing a vacuum chamber which houses a holder including a presser and a support, wherein the holder holds the wafer by sandwiching the outer circumferential surplus region of the wafer between the presser and the support, the presser and the support each including a central through opening;
    a holding step of holding the wafer with the holder by sandwiching the outer circumferential surplus region of the wafer between the presser and the support;
    a defining step of defining an upper compartment and a lower compartment in the vacuum chamber with the wafer held by the holder, wherein the upper compartment is separated from the lower compartment by the holder;
    an evacuating step of evacuating the upper compartment and the lower compartment and developing a positive pressure in the lower compartment with respect to the upper compartment to cancel out flexing of the wafer held by the holder due to gravity; and
    after the evacuating step, a processing step of performing a predetermined process on the wafer held by the holder with a processing unit disposed in the vacuum chamber.

5. The wafer processing method according to claim 4, wherein the processing step includes a step of forming a metal film on the reverse side of the wafer in alignment with the device region.

6. The wafer processing method according to claim 4, wherein the wafer has an annular ridge disposed on the outer circumferential surplus region and surrounding the circular recess.

7. The wafer processing apparatus according to claim 1, wherein the support of the holder including a positioning member that configured to position the wafer on an upper surface of the support.

8. The wafer processing method according to claim 4, further comprising positioning the wafer on the support using a positioning member on an upper surface of the support.

9. The wafer processing apparatus according to claim 1, further comprising a vacuum pump connected to a first valve associated with the upper compartment and connected to a second valve associated with the lower compartment.

10. The wafer processing apparatus according to claim 9, further comprising an air supply source connected the lower compartment, wherein the air supply source supplies air to the lower compartment.

11. The wafer processing method according to claim 4, wherein the evacuating step includes evacuating air through a first valve associated with the upper compartment and through a second valve associated with the lower compartment.

12. The wafer processing method according to claim 11, further comprising an air supply step of supplying air to the lower compartment from an air supply source.

* * * * *